United States Patent
Schultheis et al.

(10) Patent No.: US 11,428,770 B2
(45) Date of Patent: Aug. 30, 2022

(54) METHOD OF CALIBRATING A SETUP

(71) Applicant: Rohde & Schwarz GmbH & Co. KG, Munich (DE)

(72) Inventors: Jan-Patrick Schultheis, Munich (DE); Werner Held, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 190 days.

(21) Appl. No.: 16/834,733

(22) Filed: Mar. 30, 2020

(65) Prior Publication Data

US 2021/0302526 A1    Sep. 30, 2021

(51) Int. Cl.
    *G01R 35/00*   (2006.01)
    *G06F 17/12*   (2006.01)
    *G01R 27/28*   (2006.01)
    *G01R 23/175*  (2006.01)

(52) U.S. Cl.
    CPC ......... *G01R 35/005* (2013.01); *G01R 23/175* (2013.01); *G01R 27/28* (2013.01); *G06F 17/12* (2013.01)

(58) Field of Classification Search
    CPC .... G01R 35/005; G01R 23/175; G01R 27/28; G06F 17/12
    See application file for complete search history.

(56) References Cited

U.S. PATENT DOCUMENTS

| | | | |
|---|---|---|---|
| 6,300,775 B1 * | 10/2001 | Peach | G01R 27/28 324/601 |
| 7,068,049 B2 * | 6/2006 | Adamian | G01R 27/28 324/612 |
| 8,983,796 B2 | 3/2015 | Bednorz et al. | |

OTHER PUBLICATIONS

Volokhine et al., "Automation of absolute phase/power calibrations applied to real time large signal systems", Published in: 75th ARFTG Microwave Measurement Conference; 978-1-4244-6366-4/10/$26.00 © 2010 IEEE; pp. 1-4 (Year: 2010).*
Bednorz et al., "Group delay and phase measurements at converters and multistage converters without LO access:", Published in: 2009 IEEE International Conference on Microwaves, Communications, Antennas and Electronics Systems; pp. 1-5 (Year: 2009).*

* cited by examiner

*Primary Examiner* — Akm Zakaria
(74) *Attorney, Agent, or Firm* — Christensen O'Connor Johnson Kindness PLLC

(57) ABSTRACT

A method of calibrating a setup comprises: performing at least one calibration of the setup, thereby obtaining calibration data; setting a quantity representing forward tracking to be equal with a quantity representing reverse tracking; solving a system of equations having at least an unknown quantity representing the forward tracking or the reverse tracking, thereby obtaining at least one equation having the unknown quantity squared; creating based on the calibration data obtained two phase over frequency relationships for the respective quantity; determining two lines having a linear change in phase over frequency for the phase over frequency relationships created; extrapolating the lines determined to a frequency of 0 Hz; and determining the respective quantity by selecting one line of the lines extrapolated that is closer to a phase of zero, $2\pi$ or a multiple thereof at the frequency of 0 Hz.

13 Claims, 2 Drawing Sheets

METHOD OF CALIBRATING A SETUP

FIELD OF THE DISCLOSURE

Embodiments of the present disclosure relate generally to a method of calibrating a setup while taking delay and loss between an analyzer and a calibration plane in the respective setup into account.

BACKGROUND

Current calibration methods or rather algorithms used to calibrate a setup comprising an analyzer, for instance a vector network analyzer (VNA), do not provide a correction for delay or loss.

Current calibration methods or rather algorithms used to calibrate a setup comprising an analyzer, for instance a vector network analyzer (VNA), do not provide a correction for delay or loss.

Typically, a 3-term error model is used for calibrating the respective analyzer, particularly a single port of the respective analyzer. However, when using the 3-term error model, it is assumed that a quantity representing forward tracking (FT), also called forward gain or scattering parameter S21, is assumed to equal 1 such that the system of equations associated with the 3-term error model can be solved appropriately. In other words, delay and/or loss is not considered by the model used for the calibration.

Other error term models, particularly more sophisticated ones that take more error terms into account, derive from the 3-term model and, therefore, it is assumed in all models known so far that the forward tracking equals 1 in order to provide a system of equations that can be solved.

Accordingly, it is not possible to correct delay and/or loss based on the calibration performed, forcing a customer or operator of the setup to perform an additional calibration step while using an additional power meter.

However, this complicates the respective delay measurements and the corresponding correction since an external device has to be connected with the respective setup to be calibrated.

SUMMARY

Accordingly, there is a need for a simplified way to calibrate an analyzer while taking delay and/or loss between the analyzer and a calibration plane into account.

Embodiments of the present disclosure provide a method of calibrating a setup while taking delay and loss between an analyzer and a calibration plane in the respective setup into account. In an embodiment, the method comprises the steps of:

Performing at least one calibration of the setup by three calibration standards or a calibration kit encompassing three calibration standards, thereby obtaining calibration data, Setting a quantity representing forward tracking to be equal with a quantity representing reverse tracking, Solving a system of equations having at least an unknown quantity representing the forward tracking or the reverse tracking, thereby obtaining at least one equation having the unknown quantity squared, Creating based on the calibration data obtained two phase over frequency relationships for the respective quantity, wherein the two phase over frequency relationships are assigned to the results of the square route of the squared unknown quantity when solving the at least one equation, Determining two lines having a linear change in phase over frequency for the phase over frequency relationships created, Extrapolating the lines determined to a frequency of 0 Hz, and Determining the respective quantity by selecting one line of the lines extrapolated that is closer to a phase of zero, $2\pi$ or a multiple thereof at the frequency of 0 Hz.

Accordingly, the known calibration techniques, methods or algorithms are extended by the assumption that the connection between the analyzer and the calibration plane is a reciprocal one since the quantity representing forward tracking and the quantity representing reverse tracking are deemed to be equal rather than setting the quantity representing forward tracking to be 1. In other words, it is assumed that the connection between the analyzer and the calibration plane is provided by at least one passive component having reciprocal characteristics with regard to signal processing.

As mentioned above, the known techniques, methods or algorithms derived from the calibration measurements do not consider delay and/or loss between the analyzer and the respective calibration plane. However, this is overcome by the extension according to the present disclosure due to the assumption that the connection is a reciprocal one. Therefore, a correct treatment of loss can be ensured.

The three calibration standards may relate to separately formed calibration standards that are connected with the setup in a subsequent manner. Alternatively, a calibration kit that encompasses the three calibration standards is connected once with the setup wherein the respective calibration steps of the at least one calibration are performed in a subsequent manner (without manual interaction). Accordingly, the calibration can be performed in a fully automatic manner when using the calibration kit.

Since the quantity representing forward tracking and the quantity representing reverse tracking are set to be equal, the product of these quantities results in a squared quantity representing forward tracking or reverse tracking. Hence, the respective unknown quantity is provided in a squared manner. The respective equation to be solved corresponds to a quadratic equation, providing two mathematically possible solutions that both are taken into consideration by the two phase over frequency relationships created.

However, only one of these two mathematically possible solutions is the physically correct one. This is verified by extrapolating the respective linear phase over frequency relationships to a frequency of 0 Hz and, then, selecting the respective line that is closer to a phase of zero, $2\pi$ or a multiple thereof at the frequency of 0 Hz.

The idea is based on the fact that a physically correct phase shift at a frequency of 0 Hz shall correspond to zero, $2\pi$ or rather a multiple thereof, for instance $4\pi$, $6\pi$ and so on. Since the respective phase over frequency relationships are created in a linear manner, no further phase shift is introduced when extrapolating the lines determined to the frequency of 0 Hz.

Accordingly, the physically correct solution of the quadratic equation comprising the squared unknown quantity representing forward tracking or reverse tracking can be identified easily, providing the physically correct result of the unknown quantity that is used for the forward tracking and the reverse tracking.

For determining the respective unknown quantities, the following equation is applicable:

$$\frac{b}{a} = S_{11} + \frac{S_{12} * S_{21} * \Gamma}{1 - S_{22} * \Gamma},$$

wherein a and b correspond to the waves in forward direction and reverse direction at the analyzer, Γ corresponds to the description of the respective calibration standard, and wherein $S_{xx}$ corresponds to the respective scattering parameter. $S_{21}$ corresponds to the quantity representing the forward tracking ("FT"), whereas $S_{12}$ corresponds to the quantity representing the reverse tracking ("RT"). Moreover, $S_{11}$ corresponds to the directivity ("D") and $S_{22}$ corresponds to the source match ("SM").

Since $S_{21}$ and $S_{12}$ are set to be equal, for instance labelled as follows $S_{xy}$, the above-mentioned equation can be formulated as follows:

$$\frac{b}{a} = S_{11} + \frac{S_{xy}^2 * \Gamma}{1 - S_{22} * \Gamma},$$

which is a quadratic equation having two mathematically possible solutions. In some embodiments, $S_{xy}$ may correspond to $S_{21}$ or $S_{12}$ which are set equal as mentioned above.

According to an aspect, the respective steps, except for the step of performing the at least one calibration, are performed, for example, in a fully automatic manner. As described above, the step of performing the at least one calibration can also be performed in a fully automatic manner depending on the kind of calibration standards used. In some embodiments, the step of performing the at least one calibration can be performed in a fully automatic manner provided that a calibration kit is connected with the setup, which encompasses the three different calibration standards. Alternatively, the step of performing the at least one calibration has to be done in a semi-automatic manner since the separately formed calibration standards have to be connected with the setup manually.

In any case, the other steps can be performed in a fully automatic manner by a processing circuit or module, for instance a control and/or analyzing circuit or module, that processed the calibration data obtained appropriately in order to automatically determine the physically correct quantity as described above.

Another aspect provides that a respective function value of the lines is determined at the frequency of 0 Hz, wherein the respective function value determined is compared with zero, $2\pi$ or a multiple thereof in order to determine the quantity. Thus, the physically correct solution of the quadratic equation is obtained by determining the respective function value of the lines at the frequency of 0 Hz.

According to another aspect, waves in forward direction and waves in reverse direction are determined at the calibration plane based on the respective waves measured at the analyzer and the respective quantity determined. In some embodiments, a correct treatment of loss and/delay is ensured since the respective quantity has been determined as described above. Besides the respective waves measured at the analyzer and the respective quantity determined, further quantities used by the respective equations are taken into consideration.

The waves in forward direction as well as the waves in reverse direction can be determined by the following equation:

$$\begin{pmatrix} b \\ b_c \end{pmatrix} = \begin{pmatrix} S_{11} & S_{21} \\ S_{12} & S_{22} \end{pmatrix} \begin{pmatrix} a \\ a_c \end{pmatrix},$$

wherein a and b correspond to the waves in forward direction and reverse direction at the analyzer, respectively. $a_c$ and $b_c$ correspond to the waves in forward direction and reverse direction at the calibration plane. Furthermore, $S_{21}$ and $S_{12}$ are set to be equal wherein they correspond to the quantity determined by the steps mentioned above. $S_{11}$ and $S_{22}$ are determined by the other equations of the system of equations.

An aspect provides that the system of equations comprises at least three equations. The at least three equations may substantially correspond to the ones of a 3-term error model used for a one-port calibration. However, the quantity representing forward tracking is not set to equal 1 as mentioned above. Accordingly, the system of equations used by the method according to the present disclosure is an alternative solution to the known 3-term error model in which the quantity representing forward tracking is set to equal 1.

In general, in the one-port calibration procedure the model simplifies to just the terms describing the directivity, port match, and tracking errors at the respective (one) port. The three equations can be solved by measuring three known standards and the assumption that the quantity representing forward tracking and the quantity representing reverse tracking are equal.

Further, a 7-term error model for calibration of at least two ports is provided that uses the respective quantity determined instead of quantities obtained from a 3-term error model. Accordingly, the 7-term model can be extended to use the described calibration model instead of the 3-term model known in the state of the art. The equations used may substantially correspond to the equations of a (classical) 7-term error model, but the quantity representing forward tracking and the quantity representing reverse tracking are set to be equal. Hence, the quantity representing forward tracking is not set to equal 1 in contrast to the approaches in the prior art, but set to equal the quantity representing reverse tracking. Accordingly, the system of equations used by the method according to the present disclosure is an alternative solution, namely an extended solution, to the known 7-term error model.

Moreover, a 9-term error model for calibration of at least two ports is provided that uses the respective quantity determined instead of quantities obtained from a 3-term error model. Accordingly, the 9-term model can be extended to use the described calibration model instead of the 3-term model known in the state of the art. The equations used may substantially correspond to the equations of a (classical) 9-term error model, but the quantity representing forward tracking and the quantity representing reverse tracking are set to be equal. Hence, the quantity representing forward tracking is not set to equal 1 in contrast to the approaches in the prior art, but set to equal the quantity representing reverse tracking. Accordingly, the system of equations used by the method according to the present disclosure is an alternative solution, namely an extended solution, to the known 9-term error model.

The above-mentioned systems of equations having more than three equations are used for calibration of at least two ports of the analyzer.

Further, the calibration may be done without performing a loss calibration by a power meter. As described above, the respective loss is considered by the calibration performed while setting the quantity representing forward tracking to be equal with the quantity representing reverse tracking. Hence, it is no more necessary to perform a loss calibration by a separately formed power meter, reducing the efforts and time required for performing the overall calibration of the respective setup.

In addition, an absolute phase calibration of the analyzer can be performed in order to extend the absolute phase calibration to the calibration plane. Once the calibration plane has been calibrated as described above, an absolute phase calibration of the analyzer can be extended appropriately such that the calibration plane can be calibrated with regard to the absolute phase.

Further, the calibration may be performed for each port and each frequency intended for use.

Another aspect provides that at least one of a port match calibration and a source match calibration is done, and wherein a group delay measurement is performed subsequently. Accordingly, a port match and/or load match calibration is done by the steps mentioned above. Afterwards, a group delay measurement can be performed in order to determine the respective group delay.

The group delay measurement may be done by a one tone measurement or a two tone measurement. The analyzer may generate a (harmonic) dual-tone signal (two tone signal), namely two sinusoidal signals with a given frequency difference, which is used as an excitation signal for the respective measurement.

In some embodiments, the group delay can be determined by generating the two tone signal, forwarding the two tone signal and measuring a response signal comprising two signals which are each phase-distorted relative to the two tone signal. Hence, a phase between the two tone signal and a phase difference between the signals associated with the response signal can be determined. From the respective phase differences and the frequency difference of the two tone signal, the group delay time can be calculated.

As mentioned above, the respective calibration may be performed for each port and each frequency intended.

Furthermore, the three calibration standards used for the calibration may correspond to an open standard, a short standard and a match standard, also called OSM standards. Alternatively, the three calibration standards used for the calibration may correspond to an offset short standard, a short standard and a match standard. These standards can be used for performing the respective calibrations of the setup in a known manner, yielding the calibration data used for determining the physically correct solution of the respective equation, namely the quadratic equation that comprises the squared unknown quantity.

In some embodiments, the analyzer is a vector network analyzer (VNA).

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
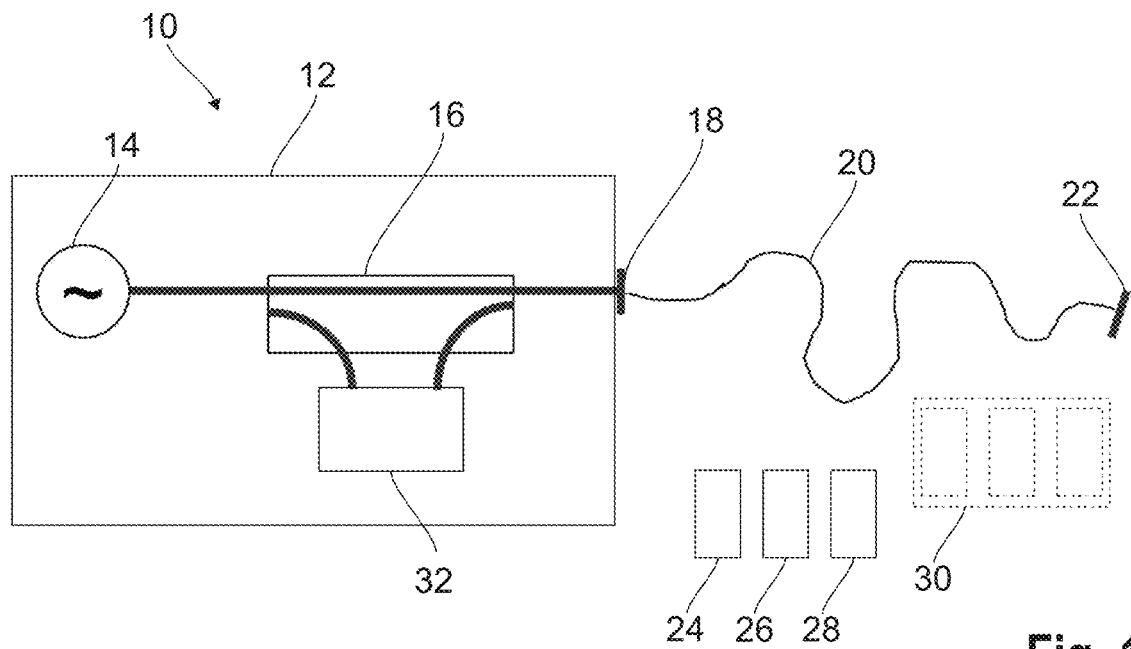
FIG. 1 schematically illustrates a representative setup comprising an analyzer and a respective calibration plane.

FIG. 1 shows a setup 10 that comprises an analyzer 12 established by a vector network analyzer (VNA). The analyzer 12 has a signal source 14, a directional coupler 16 as well as a port 18 that are connected with each other. In some embodiments, the directional coupler 16 is interconnected between the signal source 14 and the port 18. The respective components of the analyzer 12 may relate to internal components that are located within a housing of the analyzer 12 that is established by a single-housed device.

In addition, the setup 10 shows that a cable or line 20 is connected with the port 18 of the analyzer 12 wherein a calibration plane 22 is provided at a certain location associated with the cable or line 20. The calibration plane 22 may correspond to an interface with which a device under test can be connected once the setup 10 has been calibrated.

Three calibration standards 24, 26, 28 are shown that are used for calibrating the setup 10 as will be described hereinafter with reference to FIG. 2. The calibration standards 24, 26, 28 correspond to an open standard, a short standard and a match standard. Alternatively, the three standards 24, 26, 28 may correspond to an offset short standard, a short standard and a match standard. In a further alternative embodiment, the three calibration standards 24, 26, 28 are encompassed in a common calibration kit 30 that is illustrated by dashed lines in FIG. 1.

Figure 2:
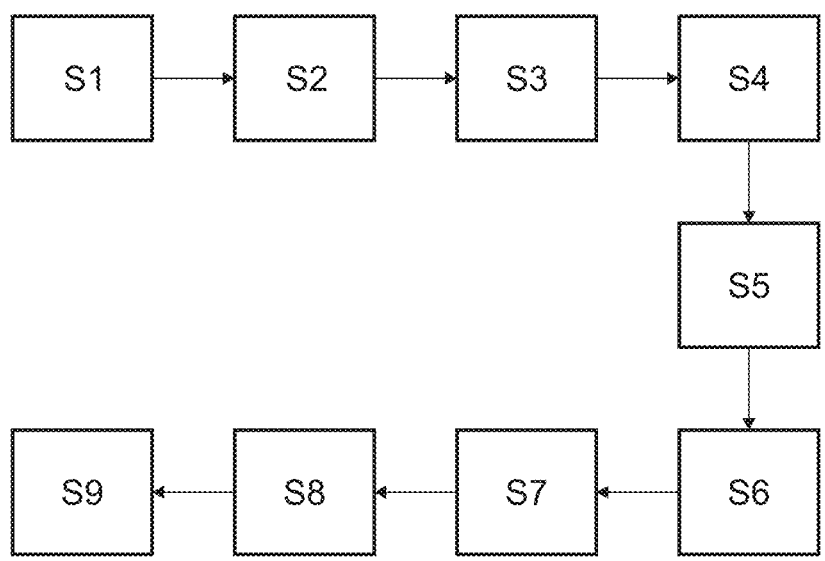
FIG. 2 is a flow-chart illustrating a method of calibrating a setup according to an embodiment of the present disclosure.

Referring to FIG. 2, a calibration of the setup 10 is performed in a first step S1 by the three calibration standards 24, 26, 28 or rather the calibration kit 30, thereby obtaining calibration data. For performing the respective calibration, the calibration standards 24, 26, 28 or rather the entire calibration kit 30 are/is connected with the calibration plane 22. Then, the calibration steps according to the respective calibration procedure are conducted. For instance, a typical calibration procedure corresponding to a so-called OSM technique is performed.

In a second step S2, the calibration data obtained is forwarded and processed by a control and/or analyzing circuit or module 32 that is assigned to the analyzer 12. For instance, the control and/or analyzing module 32 is integrated within the analyzer 12.

The control and/or analyzing module 32 is generally configured to perform the following steps in a fully automatic manner such that no manual input is required.

In a third step S3, a quantity representing forward tracking, namely the scattering parameter S21, is set to be equal with a quantity representing reverse tracking, namely the scattering parameter S12.

In a fourth step S4, a system of equations is solved that comprise at least an unknown quantity representing the forward tracking or the reverse tracking. Hence, the respective system of equations may comprise the scattering parameter S12 or the scattering parameter S21.

In some embodiments, the system of equations to be solved may comprise at least three equations for a one-port calibration.

For instance, the following equation is to be solved by the calibration data obtained:

$$\frac{b}{a} = S_{11} + \frac{S_{12} * S_{21} * \Gamma}{1 - S_{22} * \Gamma},$$

wherein a and b correspond to the waves in forward direction and reverse direction at the analyzer, $\Gamma$ corresponds to the description of the respective calibration standard, and wherein $S_{xx}$ corresponds to the respective scattering parameter. $S_{21}$ corresponds to the quantity representing the forward tracking ("FT"), whereas $S_{12}$ corresponds to the quantity representing the reverse tracking ("RT"). Moreover, $S_{11}$ corresponds to the directivity ("D") and $S_{22}$ corresponds to the source match ("SM").

When solving the system of equations, at least one equation is obtained which has the unknown quantity squared. This respective equation corresponds to a quadratic equation that has to be solved. However, the quadratic equation results in two mathematical solutions wherein only one of the mathematical solutions is the physically correct one.

Since $S_{21}$ and $S_{12}$ are set to be equal, for instance labelled as follows $S_{xy}$, the above-mentioned equation can be formulated as follows:

$$\frac{b}{a} = S_{11} + \frac{S_{xy}^2 * \Gamma}{1 - S_{22} * \Gamma}.$$

In order to identify the physically correct solution of the quadratic equation, two phase over frequency relationships for the respective quantity are created based on the calibration data obtained in a fifth step S5. The two phase over frequency relationships are assigned to the respective results of the square route of the squared unknown quantity, namely $S_{xy}^2$, when solving the at least one quadratic equation.

Hence, the phase over frequency relationships are associated with the mathematical solutions of the quadratic equation mentioned above.

In a sixth step S6, two lines are determined that have a linear change in phase over frequency for the respective phase over frequency relationships created. Hence, it is assumed that the phase changes over frequency in a linear manner.

In a seventh step S7, the lines determined are extrapolated to a frequency of 0 Hz. This is shown in FIG. 3 for both mathematically possible solutions of the above-mentioned quadratic equation.

Figure 3:
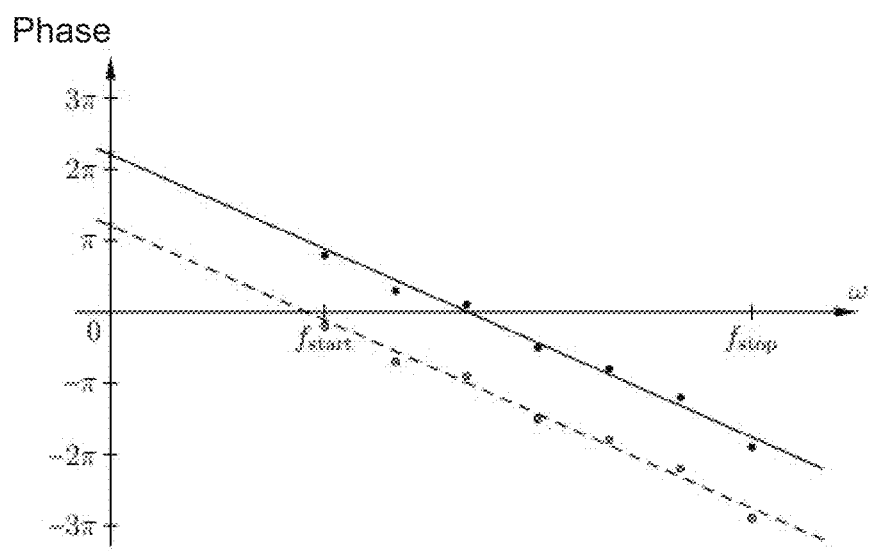
FIG. 3 shows a diagram illustrating steps of a method of calibrating a setup according to an embodiment of the present disclosure.

In some embodiments, the lines correspond to linear approximations of the respective calibration data obtained as shown in FIG. 3. The calibration data is obtained in a frequency range between $f_{start}$ and $f_{stop}$.

Since no calibration value is obtained for a frequency of 0 Hz, the respective lines, namely the linear approximations, have to be extrapolated in order to provide a function value at the frequency of 0 Hz.

In an eighth step S8, the respective quantity, namely $S_{xy}$, is determined by selecting one of the lines extrapolated that is closer to a phase of zero, $2\pi$ or a multiple thereof at the frequency of 0 Hz. The diagram shown in FIG. 3 reveals this easily.

Accordingly, the physically correct solution of the quadratic equation mentioned above is determined.

This can also be determined in an automatic manner since the function value of the determined lines is determined at the frequency of 0 Hz. Then, the function value determined at the frequency of 0 Hz is compared for each of the respective lines, namely both linear approximations, with zero, $2\pi$ or multiples thereof in order to identify the physically correct solution.

In a ninth step S9, waves in forward direction and waves in reverse direction are determined at the calibration plane 22 based on the respective waves measured at the analyzer 12 and the respective quantity determined. In some embodiments, the following equation is used for determining the respective waves:

$$\begin{pmatrix} b \\ b_c \end{pmatrix} = \begin{pmatrix} S_{11} & S_{21} \\ S_{12} & S_{22} \end{pmatrix} \begin{pmatrix} a \\ a_c \end{pmatrix},$$

wherein a and b correspond to the waves in forward direction and reverse direction at the analyzer, respectively. $a_c$ and $b_c$ correspond to the waves in forward direction and reverse direction at the calibration plane. Furthermore, $S_{21}$ and $S_{12}$ are set to be equal wherein they correspond to the quantity determined by the steps mentioned above. $S_{11}$ and $S_{22}$ are determined by the other equations of the system of equations.

Moreover, a model may be used that describes the calibration of the analyzer 12, wherein the respective model depends on the number of parameters describing the calibration of analyzer 12, for instance for 2 or more ports. By taking technical assumptions into account, the parameters can be reduced to seven or nine parameters for the calibration of at least two ports of the analyzer 12. This is also called 7/9-error term model. However, the respective 7/9-error term model is extended by using the respective quantity determined as described above according to the method of the present disclosure that is an (improved) alternative to the 3-term error model known.

Accordingly, the respective 7/9-error term model is extended to use the here described calibration model instead of the 3-term error model.

Furthermore, an absolute phase calibration of the analyzer 12 may be performed so as to extend the absolute phase calibration to the calibration plane 22. Thus, the calibration plane 22 is calibrated with regard to absolute phase.

In general, a method of calibrating the respective setup 10 is provided that takes delay and loss between the analyzer 12 and the calibration plane 22 in the respective setup 10 into account such that it is not necessary to perform an additional calibration step by a separately formed power meter.

The methods described herein can be used to perform a port match calibration and/or a source match calibration.

Moreover, the signal source 14 may be configured to provide a two tone signal that can be used to determine a group delay when performing a group delay measurement.

Based on the port match calibration and/or source match calibration, the group delay measurement can be performed subsequently in order to determine the group delay.

Put differently, a port match calibration and/or a source match calibration can be obtained due to the calibration achieved by the method(s) described above.

Furthermore, the signal source 14 may also be used for a one tone measurement in order to perform the group delay measurement.

Generally, a simplified way to calibrate the analyzer 12 is provided while taking delay and/or loss between the analyzer 12 and a calibration plane 22 into account.

Certain embodiments disclosed herein utilize circuitry (e.g., one or more circuits) in order to implement protocols or standards, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of calibrating a setup while taking delay and loss between an analyzer and a calibration plane in the setup into account, wherein the method comprises:
    performing at least one calibration of the setup by three calibration standards or by a calibration kit encompassing the three calibration standards, thereby obtaining calibration data;
    setting a quantity representing forward tracking to be equal with a quantity representing reverse tracking;
    solving a system of equations having at least an unknown quantity representing the forward tracking or the reverse tracking, thereby obtaining at least one equation having the unknown quantity squared;
    creating based on the calibration data obtained two phase over frequency relationships for the respective quantity, wherein the two phase over frequency relationships are assigned to the results of the square root of the unknown quantity squared when solving the at least one equation;
    determining two lines having a linear change in phase over frequency for the two phase over frequency relationships created;
    extrapolating the two lines determined to a frequency of 0 Hz; and
    determining the respective quantity by selecting one line of the two lines extrapolated that is closer to a phase of zero, $2\pi$ or a multiple thereof at the frequency of 0 Hz, wherein a 9-term error model for calibration of at least two ports is provided that uses the respective quantity determined instead of quantities obtained from a 3-term error model.

2. The method according to claim 1, wherein the steps, except for the step of performing the at least one calibration, are performed in a fully automatic manner.

3. The method according to claim 1, wherein a respective function value of the two lines is determined at the frequency of 0 Hz, and wherein the respective function value determined is compared with zero, $2\pi$ or a multiple thereof in order to determine the quantity.

4. The method according to claim 1, wherein waves in forward direction and waves in reverse direction are determined at the calibration plane based on the respective waves measured at the analyzer and the respective quantity determined.

5. The method according to claim 1, wherein the system of equations comprises at least three equations.

6. The method according to claim 1, wherein the calibration is done without performing a loss calibration by a power meter.

7. The method according to claim 1, wherein an absolute phase calibration of the analyzer is performed in order to extend the absolute phase calibration to the calibration plane.

8. The method according to claim 1, wherein at least one of a port match calibration and a source match calibration is done, and wherein a group delay measurement is performed subsequently.

9. The method according to claim 8, wherein the group delay measurement is done by a one tone measurement or a two tone measurement.

10. The method according to claim 1, wherein the three calibration standards used for the calibration correspond to an open standard, a short standard and a match standard or wherein the three calibration standards used for the calibration correspond to an offset short standard, a short standard and a match standard.

11. The method according to claim 1, wherein the analyzer is a vector network analyzer.

12. A method of calibrating a setup while taking delay and loss between an analyzer and a calibration plane in the setup into account, wherein the method comprises:
performing at least one calibration of the setup by three calibration standards or by a calibration kit encompassing the three calibration standards, thereby obtaining calibration data;
setting a quantity representing forward tracking to be equal with a quantity representing reverse tracking;
solving a system of equations having at least an unknown quantity representing the forward tracking or the reverse tracking, thereby obtaining at least one equation having the unknown quantity squared;
creating, based on the calibration data obtained, two phase over frequency relationships for the respective quantity, wherein the two phase over frequency relationships are assigned to the results of the square root of the unknown quantity squared when solving the at least one equation;
determining two lines having a linear change in phase over frequency for the two phase over frequency relationships created;
extrapolating the two lines determined to a frequency of 0 Hz; and
determining the respective quantity by selecting one line of the two lines extrapolated that is closer to a phase of zero, $2\pi$ or a multiple thereof at the frequency of 0 Hz, and
wherein it is assumed that the connection between the analyzer and the calibration plane is provided by at least one passive component having reciprocal characteristics with regard to signal processing.

13. A method of calibrating a setup while taking delay and loss between an analyzer and a calibration plane in the setup into account, wherein the method comprises:
performing at least one calibration of the setup by three calibration standards or by a calibration kit encompassing the three calibration standards, thereby obtaining calibration data;
setting a quantity representing forward tracking to be equal with a quantity representing reverse tracking;
solving a system of equations having at least an unknown quantity representing the forward tracking or the reverse tracking, thereby obtaining at least one equation having the unknown quantity squared;
creating, based on the calibration data obtained, two phase over frequency relationships for the respective quantity, wherein the two phase over frequency relationships are assigned to the results of the square root of the unknown quantity squared when solving the at least one equation;
determining two lines having a linear change in phase over frequency for the two phase over frequency relationships created;
extrapolating the two lines determined to a frequency of 0 Hz; and
determining the respective quantity by selecting one line of the two lines extrapolated that is closer to a phase of zero, $2\pi$ or a multiple thereof at the frequency of 0 Hz,
wherein a port match calibration and a source match calibration are done, wherein a group delay measurement is performed subsequently, and
wherein the group delay measurement is done by a two tone measurement such that the analyzer generates two sinusoidal signals with a given frequency difference, resulting in a two tone signal which is used as an excitation signal for the respective measurement.

* * * * *